(12) United States Patent
Sawaki et al.

(10) Patent No.: US 6,888,867 B2
(45) Date of Patent: May 3, 2005

(54) SEMICONDUCTOR LASER DEVICE AND FABRICATION METHOD THEREOF

(75) Inventors: Nobuhiko Sawaki, 3-103, Chikusanishijutaku 1-6-33, Kitachikusa, Chikusa-ku, Nagoya-shi Aichi (JP); Yoshio Honda, Nagoya (JP); Norifumi Kameshiro, Nagoya (JP); Masahito Yamaguchi, Nagoya (JP); Norikatsu Koide, Tenri (JP); Shigetoshi Ito, Ikoma (JP); Tomoki Ono, Nara (JP); Katsuki Furukawa, Sakai (JP)

(73) Assignees: Nobuhiko Sawaki, Nagoya (JP); Sharp Kabushiki Kaisha, Osaka (JP)

( * ) Notice: Subject to any disclaimer, the term of this patent is extended or adjusted under 35 U.S.C. 154(b) by 4 days.

(21) Appl. No.: 10/109,458

(22) Filed: Mar. 26, 2002

(65) Prior Publication Data

US 2003/0031219 A1 Feb. 13, 2003

(30) Foreign Application Priority Data

Aug. 8, 2001 (JP) ...................................... 2001-240413

(51) Int. Cl.[7] ............................................... H01S 5/00
(52) U.S. Cl. ............................ 372/45; 372/43; 372/44; 372/46
(58) Field of Search ............................ 372/43, 45, 46, 372/42, 40; 257/34, 80, 94, 88, 190, 103; 438/40

(56) References Cited

U.S. PATENT DOCUMENTS

| | | | | |
|---|---|---|---|---|
| 5,689,123 A | * | 11/1997 | Major et al. | 257/190 |
| 5,835,516 A | * | 11/1998 | Miyashita et al. | 372/46 |
| 5,909,036 A | * | 6/1999 | Tanaka et al. | 257/94 |
| 5,920,767 A | * | 7/1999 | Horie et al. | 438/40 |
| 5,974,068 A | * | 10/1999 | Adachi et al. | 372/46 |
| 6,009,112 A | * | 12/1999 | Uchida | 372/46 |
| 6,023,484 A | * | 2/2000 | Matsumoto et al. | 372/46 |
| 6,151,347 A | * | 11/2000 | Noel et al. | 372/45 |
| 6,265,733 B1 | * | 7/2001 | Shimoyama et al. | 257/94 |
| 6,522,676 B1 | * | 2/2003 | Goto et al. | 372/43 |
| 6,635,901 B2 | * | 10/2003 | Sawaki et al. | 257/80 |
| 2002/0084467 A1 | * | 7/2002 | Krames et al. | 257/103 |
| 2002/0145148 A1 | * | 10/2002 | Okuyama et al. | 257/88 |

FOREIGN PATENT DOCUMENTS

JP  09199419 A  7/1997

OTHER PUBLICATIONS

U.S. Appl. No. 10/021,677, filed Dec. 12, 2001, Sawaki et al.

* cited by examiner

Primary Examiner—Dung T. Nguyen
(74) Attorney, Agent, or Firm—Morrison & Foerster LLP (57) ABSTRACT

A semiconductor laser device includes a substrate and an n-GaN layer composed of a nitride semiconductor formed on the substrate. The substrate includes a trench having as a slope a plane inclined 62 degrees from the main plane of the substrate, or a plane inclined within 3 degrees in an arbitrary direction from the inclined plane. The n-GaN layer is formed on the slope. On the n-GaN layer are formed a lower clad layer, an active layer, and an upper clad layer, each composed of a nitride semiconductor. The active layer has a plane orientation substantially matching the plane orientation of the main plane.

19 Claims, 7 Drawing Sheets

SEMICONDUCTOR LASER DEVICE AND FABRICATION METHOD THEREOF

BACKGROUND OF THE INVENTION

1. Field of the Invention

The present invention relates to a semiconductor laser device using a nitride semiconductor, and a method of fabricating such a semiconductor laser device.

2. Description of the Background Art

Based on the usage of nitride semiconductor material of GaN, InN and AlN and a semiconductor of mixed crystals thereof, light emitting devices with $In_xGa_{1-N}$ crystal as a light emitting layer have been produced on a sapphire substrate, GaN substrate, SiC substrate, or silicon (111) substrate.

It is to be particularly noted that a silicon substrate is superior than the other substrates by the advantage of providing those of a large area and of constant quality at low cost. Therefore, it is expected that a light emitting device can be fabricated at low cost by using a silicon substrate. Prototypes of semiconductor laser devices are now produced using nitride semiconductor material formed of a semiconductor of such mixed crystals.

By growing a nitride semiconductor using a silicon (111) substrate, a nitride semiconductor film with a C plane as the growth plane can be obtained. However, the planarity of this epitaxial semiconductor film was not so favorable at the atom level.

For example, consider the case where an n type clad layer, a quantum well type light emitting layer formed of $In_xGa_{1-x-N}$, and a p type clad layer are stacked on such a substrate to produce an LD (Laser Diode) of a microstructure. The thickness of the light emitting layer and the In composition are not uniform due to the non-planarity of the film. This unevenness affects the light radiation. It was therefore difficult to obtain induced emission since the emission spectrum has a wide half band width of 40 nm. Only a semiconductor laser device having a high threshold current could be obtained. The obtained device was inferior to a device provided on a sapphire substrate or SiC substrate. It was difficult to obtain a semiconductor laser device of small driving current.

There was another disadvantage of laser using nitride semiconductor material. Specifically, it was found that a semiconductor laser device of low driving current could not be fabricated unless a nitride semiconductor material containing Al that exhibits a large energy gap at respective clad layers formed above and below the active layer is used. The usage of this material allows sufficient light and electrons to be confined in the active layer to emit light at high efficiency.

However, nitride semiconductor material containing Al is disadvantageous in that a crack is easily generated as the crystal grows. It is necessary to prevent generation of cracks in the case where nitride semiconductor material containing Al is used for the clad layers formed above and below the active layer for the purpose of improving the initial characteristics of the threshold value and the like of the semiconductor layer and prevent degradation of the lifetime. The thermal expansion coefficient of silicon is smaller than that of a nitride semiconductor. Therefore, in the case where a silicon substrate is employed, the grown nitride semiconductor is subjected to tensile stress when returned to ambient temperature. There was a problem that a crack is easily generated than when a sapphire substrate or the like is used.

SUMMARY OF THE INVENTION

In view of the foregoing, an object of the present invention is to provide a semiconductor laser device that can have generation of cracks suppressed and that has superior photoelectric property, and a method of fabricating such a semiconductor laser device.

According to an aspect of the present invention, a semiconductor laser device includes a substrate, and a compound semiconductor layer composed of a nitride semiconductor formed on the substrate. The substrate includes a trench having a plane inclined 62 degrees from the main surface of the substrate or a plane inclined within 3 degrees in an arbitrary direction from the inclined plane as a slope. The compound semiconductor layer is formed on this slope. On the compound semiconductor layer are provided a lower clad layer, an active layer, and an upper clad layer, each composed of a nitride semiconductor. The active layer has a plane orientation substantially matching the plane orientation of the main plane.

According to another aspect of the present invention, a semiconductor laser device includes a substrate and a compound semiconductor layer composed of a nitride semiconductor formed on the substrate. The substrate includes a trench having a plane inclined 62 degrees from the main plane of the substrate, or a plane inclined within 3 degrees in an arbitrary direction from the inclined plane as a slope. The compound semiconductor layer is formed on the slope. On the compound semiconductor layer are provided a lower clad layer composed of a nitride semiconductor, an active layer composed of a nitride semiconductor, and an upper clad layer. The lower clad layer and the upper clad layer are composed of a nitride semiconductor containing Al.

The substrate is preferably formed of silicon.

According to a further aspect of the present invention, a semiconductor laser device includes a silicon substrate, and a compound semiconductor layer composed of a nitride semiconductor formed on the silicon substrate. The silicon substrate includes a trench having a plane inclined 6 degrees from the main plane of the silicon substrate or a plane inclined within 3 degrees in an arbitrary direction from the inclined plane as a slope. The compound semiconductor layer is formed on the slope. Also, a lower clad layer, an active layer, and an upper clad layer, each composed of a nitride semiconductor, are provided.

According to still another aspect of the present invention, a semiconductor laser device includes a silicon substrate, and a compound semiconductor layer composed of a nitride semiconductor formed on the silicon substrate. The compound semiconductor layer is formed using a silicon substrate having a main plane composed of a plane corresponding to a (100) plane rotated 7.3 degrees about a [01-1] axis, or a plane inclined in a range within 3 degrees in an arbitrary direction from the rotated plane. The silicon substrate includes a trench having a (111) plane as a slope. The compound semiconductor layer is formed on this slope. Also, a lower clad layer, an active layer, and an upper clad layer, each composed of a nitride semiconductor, are provided.

The upper clad layer and lower clad layer are preferably composed of a nitride semiconductor containing Al. The active layer may have a plane orientation substantially matching the plane orientation of the main plane of the substrate.

The <0001> direction of the compound semiconductor layer can be substantially perpendicular to the slope. The active layer can have the (1-101) plane as the plane orientation.

The trench can extend along the [11-20] direction of the compound semiconductor forming the active layer. Also, a laser beam waveguide stripe structure can be formed along the trench.

A film having growth of a nitride semiconductor suppressed can be formed at at least a portion of the substrate surface other than the slope.

According to a still further aspect of the present invention, a fabrication method of a semiconductor laser device includes the steps of forming, at a main plane of a substrate, a trench having a plane inclined 62 degrees from the main plane, or a plane inclined within 3 degrees in an arbitrary direction from the inclined plane as a slope, growing crystal of a nitride semiconductor on the slope to form a compound semiconductor layer, and sequentially stacking on the compound semiconductor layer, a lower clad layer, an active layer and an upper clad layer, each composed of a nitride semiconductor.

According to yet a further aspect of the present invention, a fabrication method of a semiconductor laser device includes the steps of forming a trench having a (111) plane as a slope at a main plane of a silicon substrate having a main plane composed of a plane corresponding to a (100) plane rotated 7.3 degrees about a [01-1] axis, or a plane inclined in a range within 3 degrees in an arbitrary direction from the rotated plane, growing crystal of a nitride semiconductor on the slope to form a compound semiconductor layer, and sequentially stacking on the compound semiconductor layer a lower clad layer, an active layer, and an upper clad layer, each composed of a nitride semiconductor.

The fabrication method of a semiconductor laser device of the above aspect can include the step of forming a film suppressed in growth of the compound semiconductor at at least a portion of the substrate surface other than the slope.

A plurality of the above trench are provided on the substrate. In the fabrication method of a semiconductor laser device of the present aspect, the compound semiconductor layer formed on the slope of each trench is combined as crystal growth precedes.

The fabrication method of a semiconductor laser device can include the step of removing the substrate after the compound semiconductor layer is formed. It is preferable that crystal is grown so that the <0001> direction of a compound semiconductor layer is substantially perpendicular to the slope. The upper clad layer and the lower clad layer can be formed of a nitride semiconductor containing Al.

It is preferable to grow crystal so that the active layer has a plane orientation substantially matching the plane orientation of the main plane of the substrate. It is also preferable that the active layer has the (1-101) plane as the plane orientation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
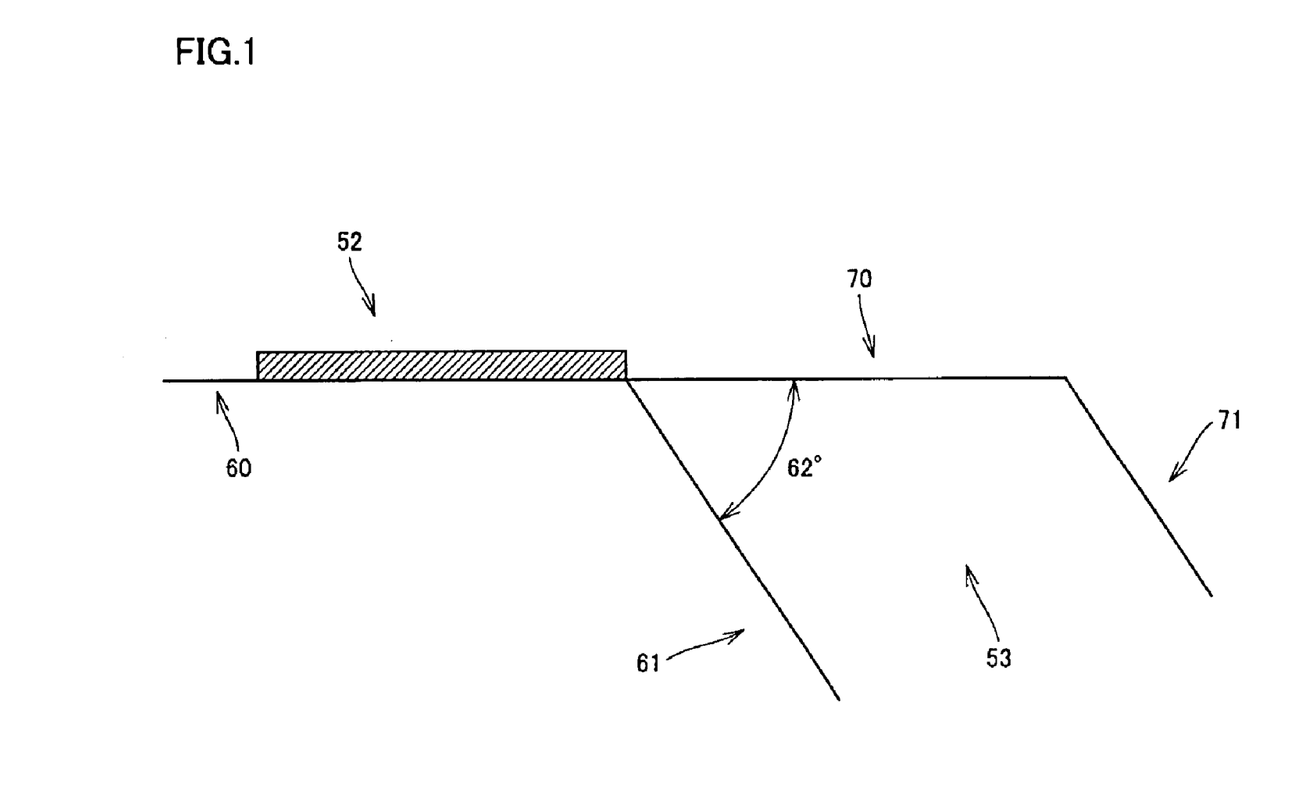
FIG. 1 is a schematic diagram to describe formation of a (1-101) facet of a compound semiconductor film.
Figure 2:
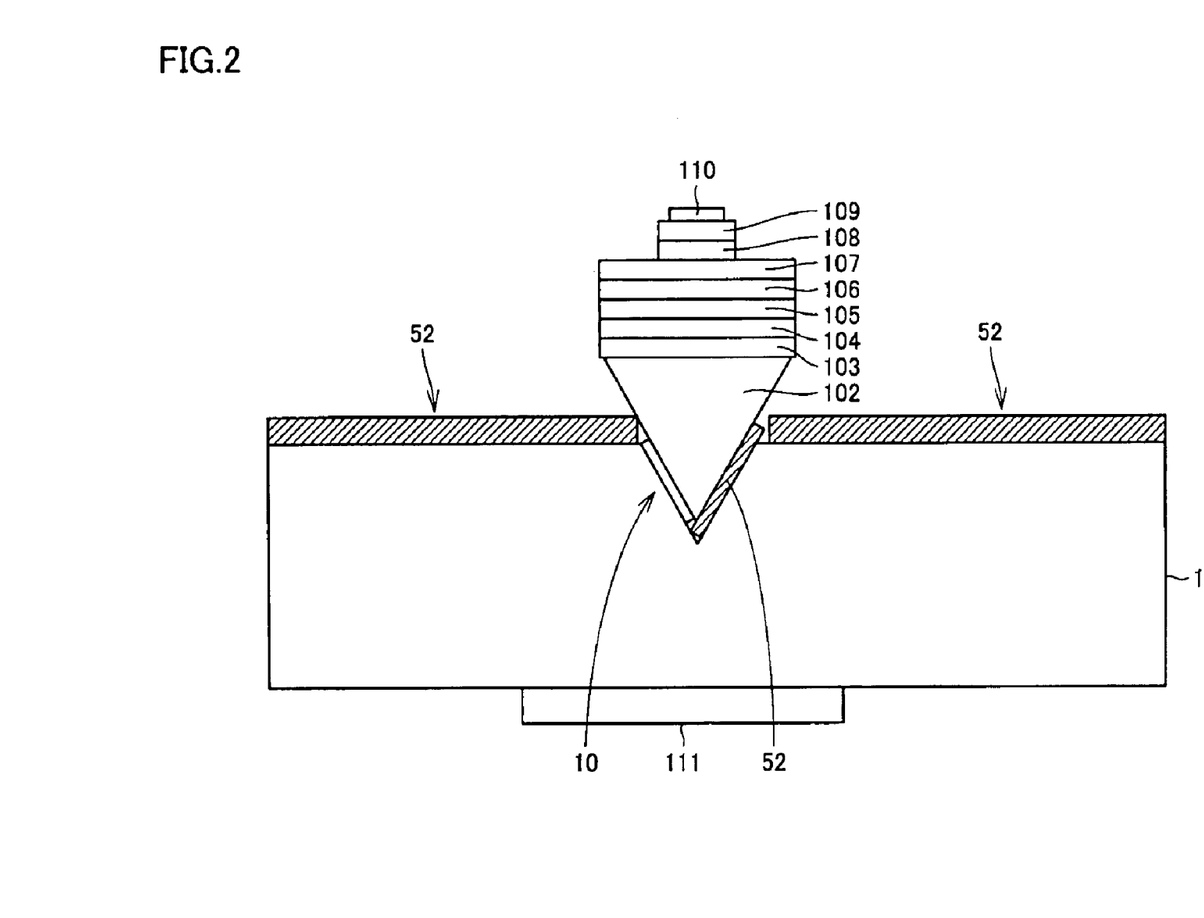
FIG. 2 is a sectional view of a semiconductor laser device according to an embodiment of the present invention.

Embodiments of the present invention will be described hereinafter with reference to the drawings First Embodiment FIG. 1 is a schematic diagram to describe formation of a (1-101) facet 70 of a nitride semiconductor film according to the first embodiment. FIG. 2 is a schematic sectional view of a structure of a nitride semiconductor laser device of the first embodiment.

The nitride semiconductor laser device of the first embodiment is formed on a (001) Si off-oriented substrate 1 inclined 7.3° to the [0-1-1] direction. Substrate 1 includes a trench in stripes. The trench has a plane inclined 62° from a main plane 60 of substrate 1 as a (111) facet 61. An n-AlGaInN layer 10 and an n-GaN layer 102 are sequentially planarized and stacked as will be described in the following on facet 61.

The top plane of n-GaN layer 102 is substantially parallel to the main plane of substrate 1, and corresponds to a (1-101) plane. Thereon, respective nitride semiconductor layers are formed, i.e. a lower clad layer 103 of n-$Al_{x1}Ga_{1-x1}N$ (X1=0.1) having a film thickness of 1.2 $\mu$m, a lower guide layer 104 of n-GaN having a film thickness of 0.1 $\mu$m, a triple quantum well active layer 105 (emission wavelength 400 nm, total film thickness 40 nm) formed of an alternate multilayer structure of a well layer of $In_wGa_{1-w}N$ (0<W<1) and a barrier layer of $In_vGa_{1-v}N$ (0≦V<W), a cap layer 106 of AlGaN having a film thickness of 20 nm, an upper guide layer 107 of p-GaN having a film thickness of 0.1 $\mu$m, a clad layer 108 of p-$Al_{x2}Ga_{1-x2}N$ (X2=0.1) having a film thickness of 0.4 $\mu$m, and a contact layer 109 of p-$Al_aIn_bGa_{1-a-b}N$ (a=0, b=0.1) having a film thickness of 0.03 $\mu$m.

On the top plane of p-$Al_aIn_bGa_{1-a-b}N$ contact layer 109, a metal electrode 110 is formed. At the back side of silicon substrate 1, a metal electrode 111 is formed. A portion of p clad layer 108 and p-$Al_aIn_bGa_{1-a-b}N$ contact layer 109 are formed in a ridge stripe configuration to obtain a structure confining light in the lateral direction of the semiconductor layer.

The semiconductor laser of the first embodiment has metal electrode 110 formed in a stripe configuration, as shown in FIG. 2. Alternatively, metal electrode 110 may be formed so that only the ridge stripe portion is in contact with the semiconductor layer, and the remaining portion is located on the semiconductor layer (p clad layer 108) with an insulation film therebetween, extending to a region other than the ridge stripe portion. In such a case, current will only flow through the ridge stripe portion, whereby a current narrow structure can be realized.

The dopant to form an n type semiconductor preferable includes Si, Ge, O, S, and Se. The dopant to form a p type semiconductor preferably includes Be, Cd, and Mg. Adding any of Si, Ge, O, S, and Se simultaneously to Be, Cd, and Mg is effective to obtain a p type layer of low resistance and small dopant diffusion.

A method of fabricating the semiconductor laser device of the present embodiment will be described hereinafter with reference to FIGS. 4–8.

Figure 4:
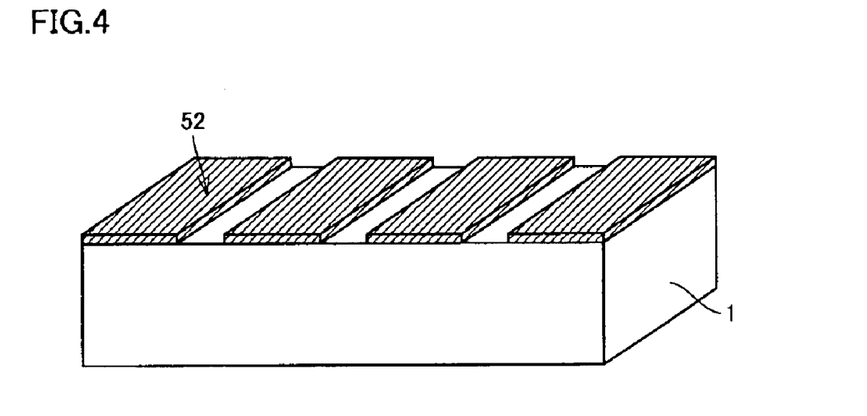
FIGS. 4 to 6 are diagrams of a semiconductor laser device of the present invention to describe first to third steps, respectively, of the fabrication method.

A (001) silicon substrate off-oriented 7.3° in the [0-1-1] direction is rinsed. A silicon oxide film or a silicon nitride film 52 is deposited to a thickness of 100 nm on the substrate by sputtering or CVD (Chemical Vapor Deposition). Then, photolithography is applied as shown in FIG. 4 to remove silicon oxide film or silicon nitride film 52 in a stripe configuration. The direction of the stripe corresponds to the Si [01-1] direction.

Figure 5:
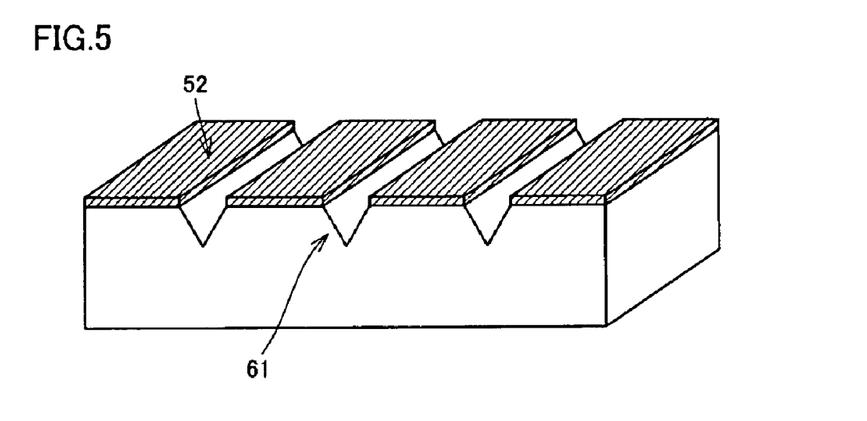

Using an alkaline etchant such as KOH or an acid etchant such as buffered hydrofluoric acid, the wafer has a trench formed, as shown in FIG. 5. The trench has an Si (111) facet 61. This trench has a stripe configuration extending in the Si [01-1] direction. (111) facet 61 has the relationship of 62° with respect to main plane 60 of silicon substrate 1, as shown in FIG. 1. This plane is a flat facet obtained by the above etching. The facet can be easily obtained by appropriately adjusting the temperature of the etchant and the etching rate.

The trench per se has a V-shaped configuration or a rough V-shaped configuration with a planar bottom. One slope of the trench corresponds to a (1-1-1) facet. Since the silicon substrate is off-oriented, the V-shape is not symmetrical. Therefore, the (111) slope is a plane inclined approximately 62° with respect to the main plane of the substrate whereas the (1-1-1) slope is a plane inclined approximately 47° with respect to the main plane of the substrate.

Figure 6:
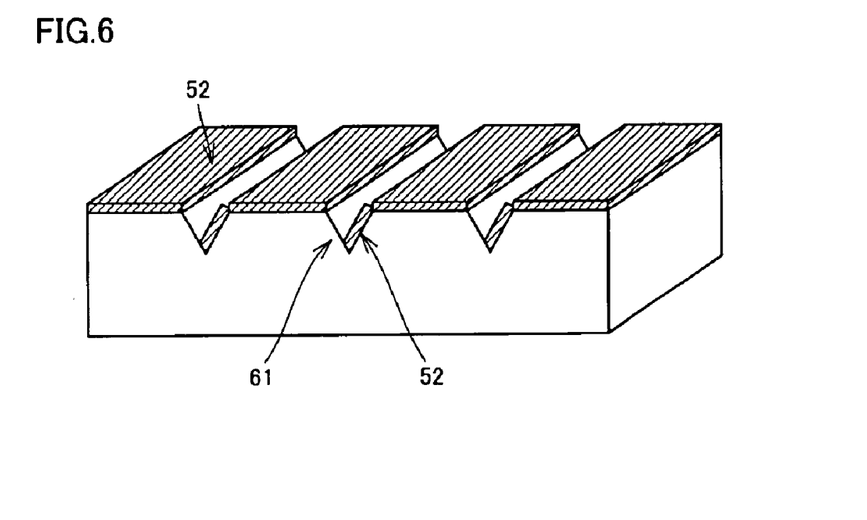

A film is grown with the substrate tilted in the sputtering apparatus so that a film is not formed on (111) facet 61. As shown in FIG. 6, a mask 52 of a silicon oxide film or silicon nitride film is formed so as to cover the (1-1-1) facet. This is the substrate for use with the production of a nitride semiconductor substrate. FIGS. 8A–8D show the relationship in orientation of the silicon substrate and facet.

Then, a nitride semiconductor film is grown under the growth condition set forth below using MOCVD (Metal Organic Chemical Vapor Deposition).

Figure 7A:
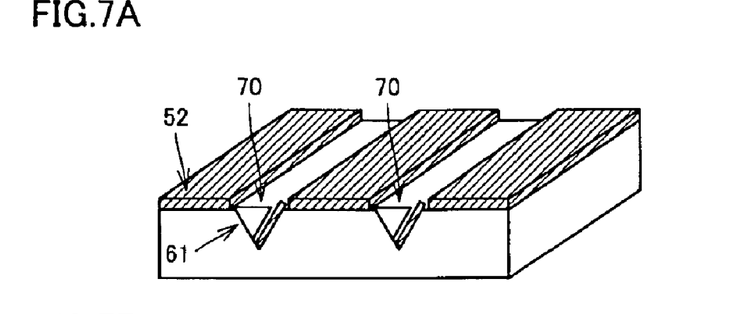
FIGS. 7A to 7D are diagrams of a semiconductor laser device of the present invention to describe a fourth step of the fabrication method.
Figure 7B:
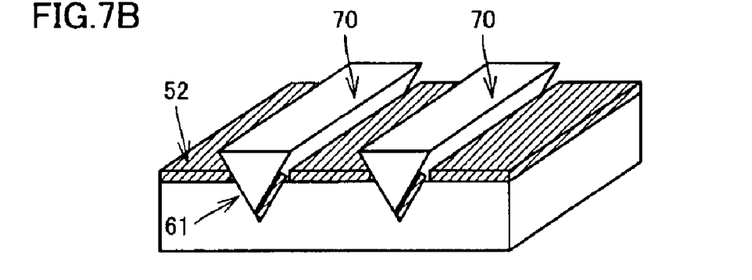

By growing the crystals of n-AlGaInN intermediate layer 10 and n-GaN layer 102 (compound semiconductor layer) on facet 61 of the silicon substrate subjected to the above-described process, a GaN crystal film having a flat GaN (1-101) plane as the top plane can be produced through the steps of FIGS. 7A and 7B. Here, intermediate layer 10 is a thin film of not more than approximately 100 nm, functioning as a buffer layer.

Crystal growth commences from the exposed (111) facet. Specifically, the nitride semiconductor to be grown is oriented so that the <0001> direction is perpendicular to the slope, as shown in FIGS. 7A and 7B. A GaN (1-101) plane 70 substantially parallel to the main plane of the substrate appears at the top plane of the grown crystal. In the stage during the growth, the crystal takes the shape of a triangular prism extending in a stripe manner.

Figure 3:
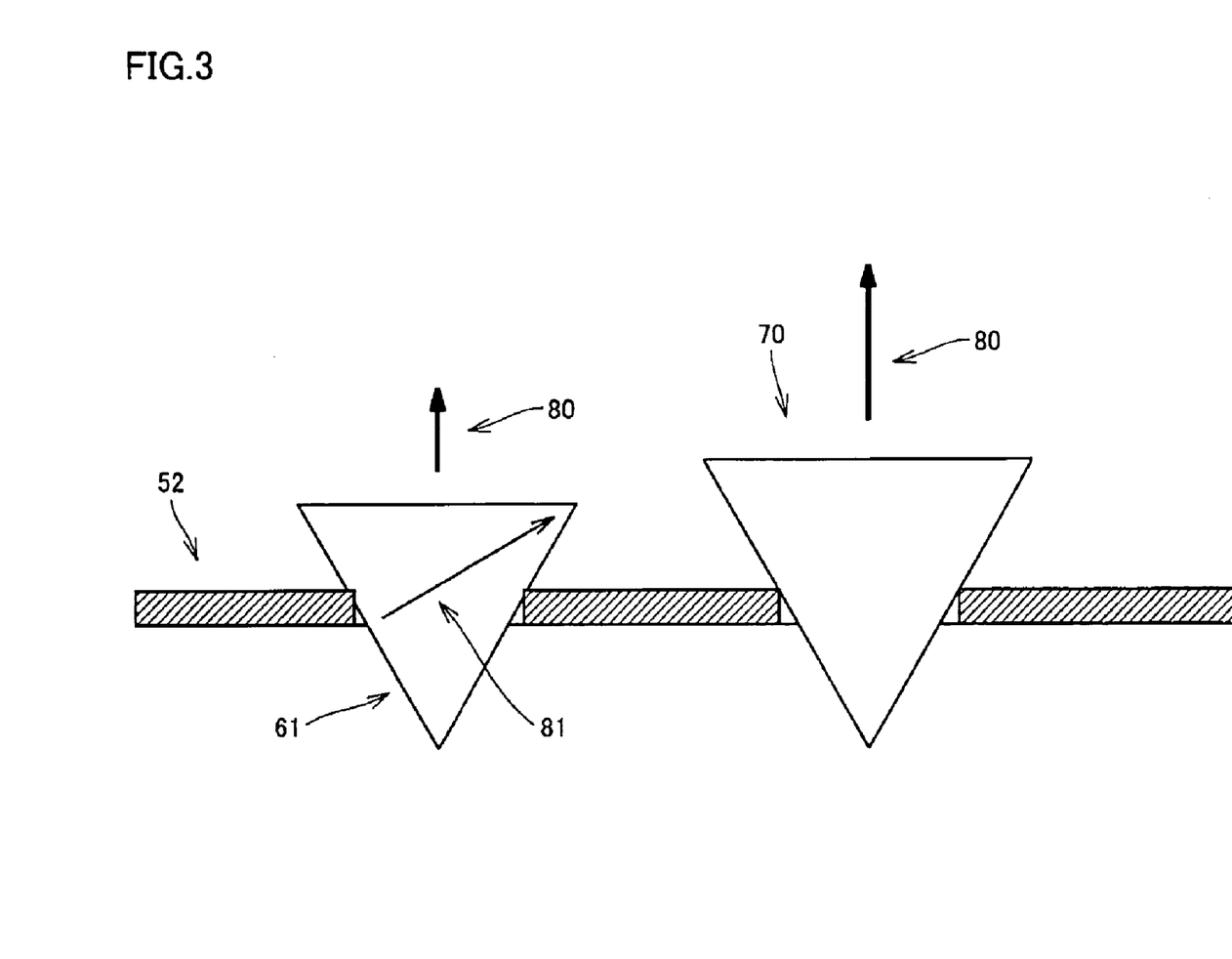
FIG. 3 shows the relationship between a substrate and a nitride semiconductor film employed in the present invention.

FIG. 3 shows the direction of growth of the nitride semiconductor. In FIG. 3, 80 designates the c axis of the nitride semiconductor, and 81 designates the direction of the growth of the nitride semiconductor. As the intermediate layer used at the initial stage of growth, a similar result can be obtained even by using an AlInN intermediate layer, AlGaN intermediate layer, or AlN intermediate layer.

In the case where a silicon substrate is used, crystal growth of the nitride semiconductor film is facilitated in the orientation of the c axis with respect to the substrate. In the present invention, a substrate is used that is off-oriented 62° with respect to the facet. Therefore, a crystal film having the (1-101) facet of a flat nitride semiconductor can be used.

Then, MOCVD is employed to sequentially form a lower clad layer 103 of n-$Al_{x1}Ga_{1-x1}N$ (X1=0.1), a lower guide layer 104 of n-GaN, a triple quantum well active layer 105 of an alternate multilayer structure of an $In_wGa_{1-w}N$ (0<W<1) well layer and an $In_vGa_{1-v}N$ (0≦V<W) barrier layer, a cap layer 106 of AlGaN, an upper guide layer 107 of p-GaN, a clad layer 108 of p-$Al_{x2}Ga_{1-x2}N$ (X2=0.1), and a contact layer 109 of p-$Al_aIn_bGa_{1-a-b}N$ (a=0, b=0.1).

Then, clad layer 108 of p-$Al_{x2}Ga_{1-2}N$ (X2=0.1) and contact layer 109 of p-$Al_aIn_bGa_{1-a-b}N$ (a=0, b=0.1) are etched away leaving a stripe portion of 2 μm in width. This results in the device structure shown in FIG. 2.

The epitaxial film formed by the above-described selective growth technique is partially masked, and a mirror end face is formed by etching using RIBE (Reactive Ion Beam Etching). The mirror end face may be formed using cleavage technique.

On the top plane of p-$Al_aIn_bGa_{1-a-b}N$ contact layer 109, metal electrode 110 is formed. Metal electrode 110 may be formed of any of Pd/Au, Ni/Pd/Au, Pd/Pt/Au, Pd/Mo/Au, and Pd/W/Au. The total film thickness is set to approximately 0.05–3 μm. Then, metal electrode 111 is formed at the back side of the substrate. Metal electrode 111 may be formed of any of Ti/Al, Zr/Al, Hf/Al, and W/Al. The total film thickness is set to approximately 0.05–3 μm.

Then, a layered structure of Mo/Au, Mo/Ni, W/Au, Cr/Ni or the like is formed to cover metal electrode 111 to facilitate wire bonding or die bonding.

The silicon substrate used here is inclined 7.3° from the (001) plane in the [0-1-1] direction. Specifically, the silicon substrate has a main plane 60 rotated 7.3° about the [01-1] axis from the (001) plane, whereby the active layer has the plane orientation of (1-101). This is substantially equal to the plane orientation of main plane 60 of the silicon substrate. An extremely flat nitride semiconductor interface having a plane orientation approximating the (1-101) plane can also be obtained when the plane is inclined within 3° in an arbitrary direction from the rotated plane.

By growing a nitride semiconductor film only on the trench as shown in FIG. 1 and form a laser structure continuously on (1-101) facet 70 of the nitride semiconductor film, a semiconductor light emitting device each separated into a crystalloid of a triangular prism individually, as shown in FIG. 2, is formed to produce individual semiconductor laser devices.

The characteristics of the produced semiconductor device were measured. A semiconductor laser device of an extremely low threshold current value of 15 mA was obtained. It is considered that this superior semiconductor laser device is obtained by the composite effect set forth below. By using an active layer that has the above-described predetermined plane orientation, a quantum well structure of extremely high planarity and small variation in the film thickness is obtained. By inclining the c axis of the GaN film from the plane of the active layer, the current caused by piezo effect at the well in the active layer and the barrier layer interface is reduced. Accordingly, the carrier recombination of the electron-hole pair is improved to result in a higher light emitting efficiency. Also, since the direction of crystal growth changes from that of the initial stage of crystallization to the (1-101) direction, the threading dislocation extending from the neighborhood of the substrate interface will no longer arrive at the active layer. Accordingly, the non-radiative recombination is reduced.

In the present invention, generation of cracks can be suppressed effectively. This is probably because of the fact that crystal growth of the AlGaN clad layer proceeds in the [1-101] direction, and that the growth of the nitride semiconductor commences from the slope that is relatively inclined from the main plane of the substrate, and the direction of growth is altered to the (1-101) direction during the growth.

In a conventional case, when a laser structure similar to that of the present embodiment is produced on a silicon substrate, cracks as many as several hundred/mm are generated. In contrast, the present invention is substantially free of cracks. The laser structure according to the present embodiment is less vulnerable to generation of cracks, as compared to the case where a laser structure similar to that of the present embodiment is produced on a sapphire substrate. The advantage of suppressing cracks is significant.

By the reduction of the threshold value and suppression of cracks in the semiconductor laser device, the lifetime of the device has increased.

As the intermediate layer employed in the initial stage of growth in the present embodiment and in the following embodiments, an AlInN intermediate layer, or an AlGaN intermediate layer can be used in addition to an AlGaInN intermediate layer. The usage of AlN is allowed. In selecting the composition of the intermediate layer, it is desirable to reduce the Ga composition in order to suppress unevenness of the substrate at the initial stage of growth. For the purpose of reducing the interface resistance when current is conducted through a silicon substrate, it is preferable to reduce the Al composition and dope at least $10^{17} cm^{-3}$ of n type impurities such as Si.

The present embodiment corresponds to the structure in which an n electrode is provided at a silicon substrate and current is conducted to the substrate from a nitride semiconductor. There is a problem that voltage easily drops at the interface between the nitride semiconductor and the silicon substrate. This problem can be effectively avoided by providing the n electrode directly at an n type nitride semiconductor, or providing an electrode that connects an n type nitride semiconductor with the silicon substrate. This can be shared with a growth-suppression film.

Second Embodiment

In the previous first embodiment, a laser device structure is directly produced on a silicon substrate that is inclined 7.3° from the (001) plane. It is also possible to use this silicon off-oriented substrate as an underlying substrate to produce a GaN substrate, and form a semiconductor laser device after producing a GaN substrate composed of continuous films.

On a silicon substrate subjected to a process similar to that of the first embodiment, an AlInN intermediate layer is grown by MOCVD. Then, GaN is grown. Through the steps for growth as shown in FIGS. 7A–7D, a GaN substrate composed of continuous films can be produced.

Figure 7C:
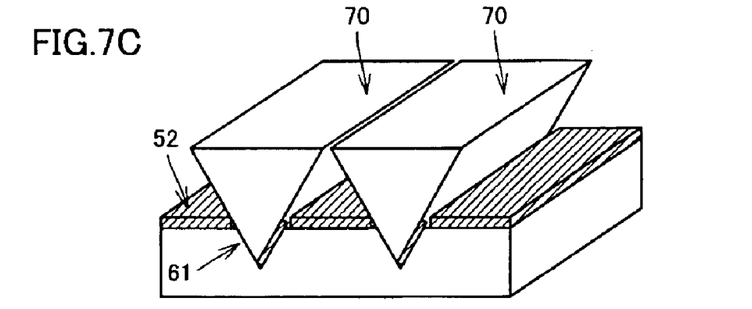
Figure 7D:
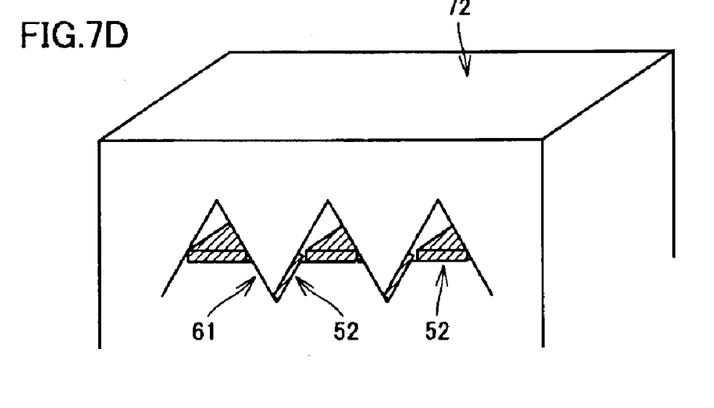
Figure 8A:
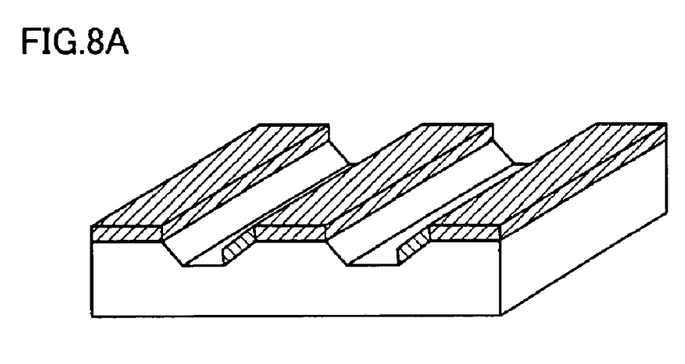
FIGS. 8A to 8D are diagrams to describe the crystal orientation relationship at a silicon substrate of the first embodiment.
Figure 8B:
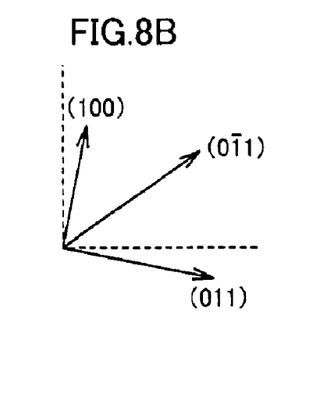
Figure 8C:
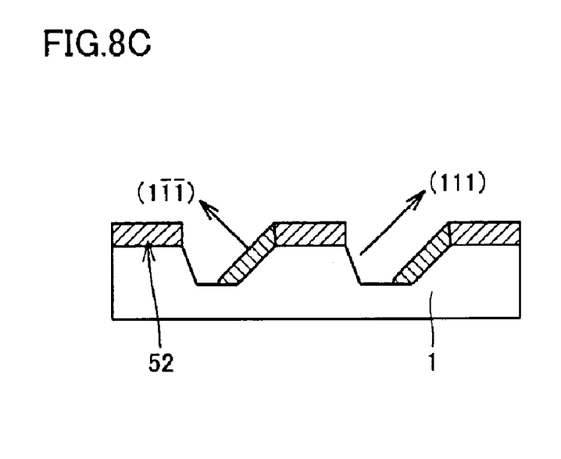
Figure 8D:
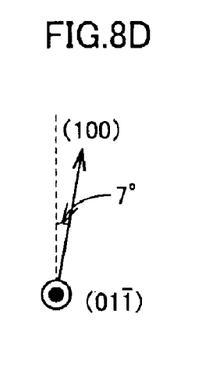

This process will be described specifically hereinafter. As shown in FIG. 7A, crystal growth commences from a (111) facet. The nitride semiconductor to be grown is arranged so that the <0001> direction is perpendicular to the slope. On the top plane of the growing crystal, a GaN (1-101) plane 70 appears substantially parallel to the main plane of the substrate, as shown in FIG. 7B. During the stage of growth, the crystal has a configuration such as a triangular prism extending in stripes. The diameter of the triangular prism increases as the growth proceeds. Eventually, adjacent crystals having the shape of a triangular prism come into contact with each other, as shown in FIG. 7C. As the growth continues, each individual crystal having the shape of a triangular prism is combined, resulting in a GaN crystal film having a flat GaN (1-101) plane 72 at the surface, as shown in FIG. 7D.

A similar result can be obtained even by using an AlInN intermediate layer, AlGaN intermediate layer, or AlGaInN intermediate layer as the intermediate layer used at the initial stage of growth.

The wafer is introduced into a HVPE (Hydride VPE) apparatus. The temperature of the substrate is raised up to approximately 1050° C. while introducing $N_2$ carrier gas and $NH_3$ respectively at 5 l/min. Then, GaCl is introduced 100 cc/min. on the substrate to initiate growth of a GaN thick film. GaCl is produced by applying HCl gas to the Ga metal maintained at approximately 850° C. Also, by introducing impurity gas using an impurity doping line that is arranged individually to the proximity of the substrate, impurities can be doped arbitrarily during the growth. For the purpose of doping Si in the present embodiment, monosilane ($SiH_4$) is supplied 200 nmol/min. (Si impurity concentration approximately $3.8 \times 10^{18} cm^{-3}$) at the same time the growing step is initiated to form an Si doped GaN film.

This growing step is carried out 8 hours to produce GaN having a total film thickness of approximately 350 μm on the silicon substrate. Following the growing step, the silicon substrate is removed by grinding or etching to obtain an extremely planar GaN substrate having a (1-101) plane. Thus, a GaN substrate having a (1-101) plane at the surface can be obtained by the present embodiment.

On this n-GaN substrate (film thickness 100 μm) are sequentially formed by MOCVD a lower clad layer 103 of n-$Al_{x1}Ga_{1-x1}N$, a lower guide layer 104 of n-GaN, a triple quantum well active layer 105, a cap layer 106 of AlGaN, an upper guide layer 107 of p-GaN, a clad layer 108 of p-$Al_{x2}Ga_{1-x2}N$ and a contact layer 109 of p-$Al_aIn_bGa_{1-a-b}N$ to obtain a semiconductor laser device wafer. It is to be noted that the n side metal electrode is formed at the back face of the n-GaN substrate. The thickness of the wafer is preferably adjusted to 70–300 μm to easily obtain a favorable cleavage end plane. In the present embodiment, the thickness of the wafer is set to 150 μm.

By cutting out the appropriately-continuous laser device from the bar using the dividing method such as scribing, dicing, or the like, an individual semiconductor laser device (chip) is fabricated. The obtained semiconductor laser device is mounted on a base such as a stem or lead frame with metal electrode 110 located at the bottom and wire-connected to the n side metal electrode, or with the n side metal electrode located at the bottom and wire-connected to metal electrode 110, to receive power from an external source for operation.

The characteristics of the produced semiconductor laser device were measured. A semiconductor laser device having an extremely low threshold current of 20 mA is obtained. It is considered that the composite effect set forth below contributes to such a semiconductor laser device. By using an active layer having the above-described predetermined plane orientation, a quantum well structure that is extremely flat and has small variation in the film thickness can be obtained. The inclination of the c axis of the GaN film from the plane of the active layer reduces the current that is generated by the piezo effect at the well in the active layer and the barrier layer interface. Accordingly, the carrier recombination of the electron-hole pair is improved to result in a higher light emitting efficiency. Also, the threading dislocation extending from the proximity of the silicon substrate interface will not reach the active layer since the direction of crystal growth is altered to the (1-101) direction from that of the initial stage during the crystal growth, whereby non-radiative recombination is reduced.

Generation of cracks can be suppressed effectively also in the present embodiment. It is considered that this is due to the effect of the crystal growth of the AlGaN clad layer proceeding in the [1-101] direction, and the silicon substrate is removed during the growth of the AlGaN clad layer.

Thus, the semiconductor laser device has a longer device lifetime by the reduction of the threshold value and suppression of cracks in the semiconductor laser device.

Third Embodiment

In the previous first embodiment, a slope inclined approximately 62° from the silicon main plane is obtained taking advantage of the property that an Si (111) plane is readily formed by etching (wet etching) using an etchant. The obtained slope is the so-called crystal facet, having stable processing accuracy and superior planarity. It is extremely efficient as an underlayer on which a nitride semiconductor is to be grown.

The range of application of the present invention is not limited thereto. The inventors carried out various experiments so as to form an inclined trench that is 62° from the main plane, instead of using a silicon substrate inclined 7.3° from the (001) plane as the main plane, by applying on the silicon plane a mask 52 partially to another plane similar to the first embodiment, and altering the etching temperature and rate.

A similar result was obtained by using such a plane. In other words, similar to the first embodiment, crystal growth can be conducted so that the GaN (1-101) plane is substantially parallel to the substrate main plane. By continuing this growth, a continuous crystal film with the planar GaN (1-101) plane at the surface can be obtained. GaN is a crystal of potent orientation. In general, the c axis is oriented perpendicular to the main plane. Therefore the obtained crystal had the C plane as the main plane. It was conventionally difficult to obtain a crystal having a plane differing from the C plane. By virtue of the present invention, a crystal having a GaN (1-101) plane as the main plane can be easily obtained.

For example, a silicon substrate off-oriented 8.6° in the [100] direction from the (2-1-1) plane is employed. By forming trenches in stripes extending in the [01-1] direction on this silicon substrate, a slope having the (211) facet inclined 62° from the main plane can be produced. By using the same, a similar GaN crystal film that has a flat surface can be obtained.

It is considered that a nitride semiconductor crystal grows with the perpendicular axis as the c axis for the (211) facet. By using a silicon off-oriented substrate that has the relationship of the angle of 62° from the (211) plane, a similar flat GaN substrate can be obtained.

In the present invention, the usage of a silicon substrate facilitates crystal growth of the nitride semiconductor film in the c axis orientation with respect to the substrate. By using a substrate that has an off-angled relationship of 62° between the facet and the substrate, a crystal film having the (1-101) facet of a planar nitride semiconductor can be employed.

By forming a semiconductor laser device shown in FIG. 2 in a manner similar to that of the first embodiment on a continuous nitride semiconductor film obtained as described above, a semiconductor laser device of high luminance can be produced on the silicon substrate. In this semiconductor laser device, the light emitting layer (active layer) has the (1-101) plane as the main plane. This differs from the conventional case where the device formed using a sapphire substrate, an SiC substrate or an Si (111) substrate has (0001) as the main plane. A thin film with the (0001) of the nitride semiconductor which is a wurtzite structure as the main plane is equivalent in band structure in the direction parallel to the main plane. However, a thin film that has the (1-101) plane as the main plane such as in the present invention is not equivalent in band structure even in the direction parallel to the main plane. Therefore, a light emitting device to which the present invention is applied has the degeneracy of the band resolved in the direction parallel to the light emitting layer (active layer). Therefore, high light emitting efficiency can be realized. Also, a significantly low threshold value can be realized in the application to a semiconductor laser device.

The substrate is not limited to silicon. Using another cubic system substrate such as GaAs, and setting the relationship of the plane orientation similar to those of the silicon in the first to third embodiments, a semiconductor laser device can be configured. It is to be noted that the silicon substrate described in the first to third embodiments is relatively stable to the growing ambient during the growth of the nitride semiconductor. The growing plane can be held in a planar state during crystal growth. There is an advantage that the effect of the present invention can be obtained stably.

The material of the substrate is not limited to a cubic system. Using an arbitrary material for the substrate, the trench can be configured as defined in the present specification. It is to be noted that in the process of forming a trench in the silicon substrate described in the first to third embodiments, the so-called facet is employed as the slope. Therefore, stability with respect to the growing ambient during the growth of the nitride semiconductor is superior. There is an advantage that the effect of the present invention is achieved stably.

Fourth Embodiment

Figure 9:
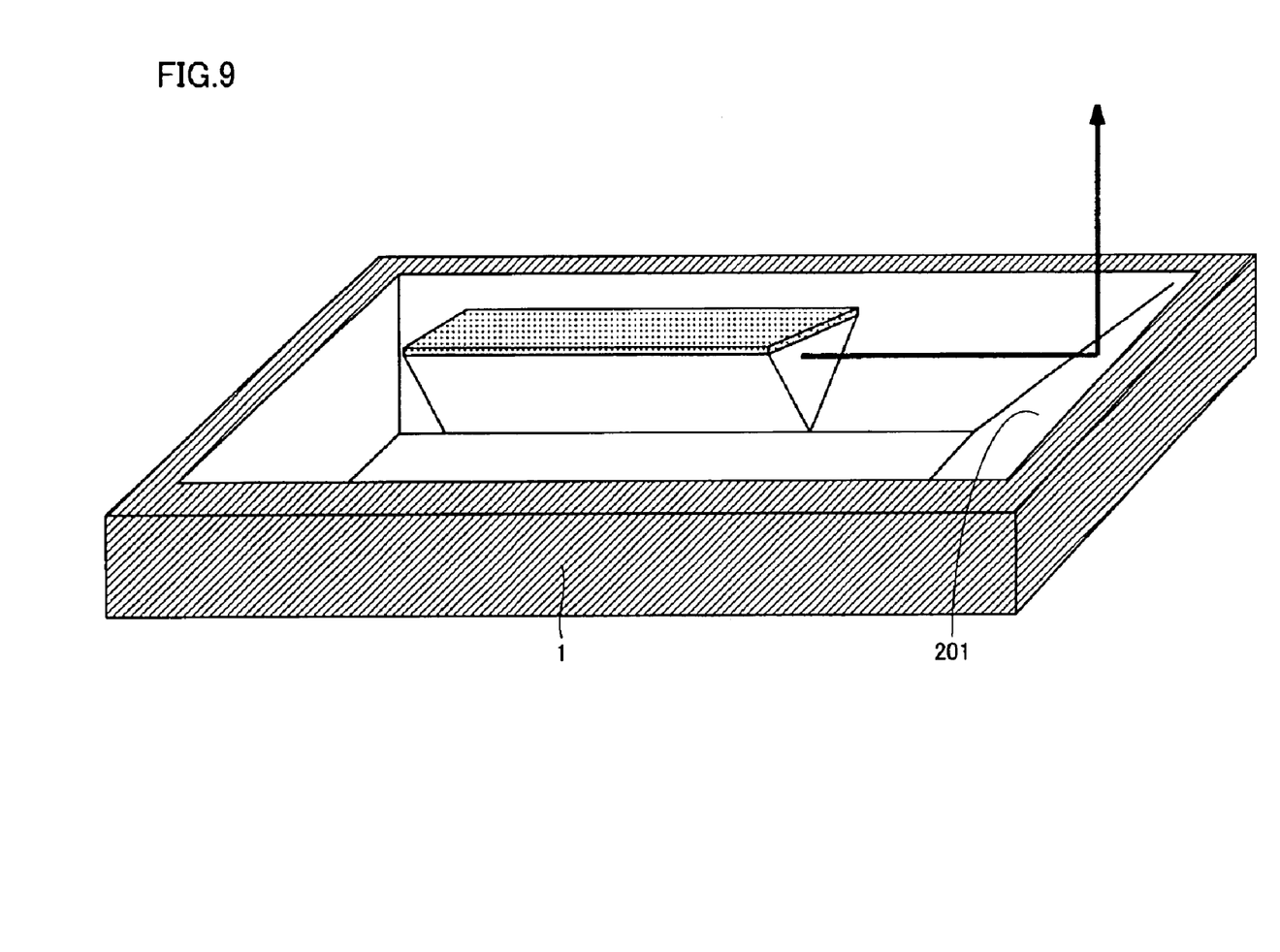
FIG. 9 is a perspective view of a semiconductor laser device structure according to a fourth embodiment.

The fourth embodiment is an application of the first embodiment. The circumference of the semiconductor laser device of the first embodiment is set as shown in FIG. 9. Specifically, the etching of the trench in the silicon substrate is applied farther than in the first embodiment. The selective growing portion, i.e., the semiconductor layer structure portion is formed downwards the surface of the silicon substrate. By etching the silicon substrate at an angle of 45° with the laser end face, a reflective plane 201 that reflects laser emitted light can be formed.

By such a structure, the laser beam emitted from the semiconductor laser can easily be output in a perpendicular manner from the silicon substrate.

The present invention relates to a nitride semiconductor laser device produced on a silicon substrate. By using a substrate rotated 7.3° about the <1-10> axis from the silicon substrate (001) plane, or a plane inclined within 3° in an arbitrary direction from the rotated plane, an extremely planar crystal film of high quality with a (1-101) epitaxial plane can be obtained. By using this epitaxial plane, a semiconductor laser device having an abrupt interface and superior photoelectric characteristics with generation of cracks suppress can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising a substrate and a compound semiconductor layer composed of a nitride semiconductor, having a wurtzite structure, formed on said substrate,
    said substrate including a trench having as a slope a plane inclined 62 degrees from a main plane of said substrate, or a plane inclined within 3 degrees from the inclined plane,
    said compound semiconductor layer being formed on said slope, and having a lower clad layer, an active layer, and an upper clad layer, each composed of a nitride semiconductor having a wurtzite structure, on said compound semiconductor layer.
    said active layer having a plane orientation substantially equal to the plane orientation of said main plane,
    and an upper surface of the compound semiconductor layer is substantially parallel to the plane orientation of said main plane.

2. A semiconductor laser device comprising a silicon substrate, and a compound semiconductor layer composed of a nitride semiconductor, having a wurtzite structure, formed on said silicon substrate,
    said silicon substrate including a trench having as a slope a plane inclined 62 degrees from a main plane of said silicon substrate, or a plane inclined within 3 degrees in a direction from the inclined plane,
    said compound semiconductor layer being formed on said slope, and having a lower clad layer, an active layer, and an upper clad layer, each composed of a nitride semiconductor having a wurtzite structure on said compound semiconductor layer, said active layer has a plane orientation substantially equal to the plane orientation of the main plane of said substrate,
    and an upper surface of the compound semiconductor layer is substantially parallel to the plane orientation of said main plane.

3. A semiconductor laser device comprising a silicon substrate, and a compound semiconductor layer composed of a nitride semiconductor, having a wurtzite structure, formed on said silicon substrate,
    said compound semiconductor layer being formed using a silicon substrate having a main plane composed of a plane corresponding to a (100) plane rotated 7.3 degrees about a axis or a plane inclined in a range within 3 degrees from the rotated plane,
    said silicon substrate including a trench having a (111) plane as a slope, said compound semiconductor layer being formed on said slope, and having a lower clad layer, an active layer, and an upper clad layer, each composed of a nitride semiconductor having a wurtzite structure, on said compound semiconductor layer.
    and an upper surface of the compound semiconductor layer is substantially parallel to the plane orientation of said main plane.

4. A semiconductor laser device according to claim 1, wherein said substrate is formed of silicon.

5. A semiconductor laser device according to claim 1, wherein said upper clad layer and said lower clad layer are formed of a nitride semiconductor, having a wurtzite structure, containing Al.

6. A semiconductor laser device according to claim 1, wherein said compound semiconductor layer has a <0001>direction substantially perpendicular to said slope.

7. A semiconductor laser device according to claim 1, wherein said active layer has a (1-101) plane as a plane orientation.

8. A semiconductor laser device according to claim 1, wherein said trench extends along a direction of the nitride semiconductor, having a wurtzite structure, constituting said active layer.

9. A semiconductor laser device according to claim 1, wherein a laser beam waveguide stripe structure is formed along said trench.

10. A semiconductor laser device according to claim 1, wherein a film having growth of a nitride semiconductor suppressed is formed at at least a portion of a surface of said substrate other than said slope.

11. A fabrication method of a semiconductor laser device comprising the steps of:
    forming at a main plane of a substrate, a trench having as a slope a plane inclined 62 degrees from said main plane, or a plane inclined within 3 degrees from the inclined plane,
    growing crystal of a nitride semiconductor, having a wurtzite structure, on said slope to form a compound semiconductor layer having an upper surface substantially parallel to the plane orientation of said main plane,
    sequentially stacking on said compound semiconductor layer a lower clad layer, an active layer, and an upper clad layer, each composed of a nitride semiconductor having a wurtzite structure, such that said active layer has a plane orientation substantially equal to the plane orientation of the main plane of said substrate.

12. A fabrication method of a semiconductor laser device comprising the steps of:
    forming a trench having a (111) plane as a slope at a main plane of a silicon substrate having said main plane composed of a plane corresponding to a (100) plane rotated 7.3 degrees about a axis, or a plane inclined in a range within 3 degrees from the rotated plane,
    growing crystal of a nitride semiconductor, having a wurtzite structure, on said slope to form a compound semiconductor layer having an upper surface substantially parallel to the plane orientation of said main plane, and
    sequentially stacking on said compound semiconductor layer a lower clad layer, an active layer, and an upper clad layer, each composed of a nitride semiconductor having a wurtzite structure, such that said active layer has a plane orientation substantially equal to the plane orientation of the main plane of said substrate.

13. The fabrication method of a semiconductor laser device according to claim 11, further comprising the step of forming a film having growth of a nitride semiconductor suppressed at at least a portion of a surface of said substrate other than said slope, prior to forming said compound semiconductor layer.

14. The fabrication method of a semiconductor laser device according to claim 11, wherein said trench is provided in plurality on said substrate, and said compound semiconductor layer formed on the slope of said trench is combined as crystal growth proceeds.

15. The fabrication method of a semiconductor laser device according to claim 14, further comprising the step of removing said substrate after said compound semiconductor layer is formed.

16. The fabrication method of a semiconductor laser device according to claim 11, wherein said crystal of a nitride semiconductor having a wurtzite structure is grown so that <0001>direction of said compound semiconductor layer is substantially perpendicular to said slope.

17. The fabrication method of a semiconductor laser device according to claim 11, wherein said upper clad layer and said lower clad layer are formed of a nitride semiconductor, having a wurtzite structure, containing Al.

18. The fabrication method of a semiconductor laser device according to claim 11, wherein said active layer has a (1-101) plane as a plane orientation.

19. A semiconductor laser device comprising a compound semiconductor layer composed of a nitride semiconductor having a wurtzite structure, having a lower clad layer, an active layer, and an upper clad layer formed on said compound semiconductor layer, wherein said lower clad layer, said active layer, and said upper clad layer are formed of a nitride semiconductor having a wurtzite structure, and said active layer has a (1-101) plane as a plane orientation, and an upper surface of the compound semiconductor layer is substantially parallel to the plane orientation of said main plane, and wherein the semiconductor laser device further comprises a laser beam waveguide stripe structure extending along the [11-20]direction of the compound semiconductor layer.

* * * * *